United States Patent [19]

Allen, Jr. et al.

[11] 4,380,075

[45] Apr. 12, 1983

[54] MODE STABLE INJECTION LASER DIODE

[75] Inventors: Louis B. Allen, Jr., Florissant; Herbert G. Koenig, Jr., St. Charles, both of Mo.

[73] Assignee: McDonnell Douglas Corporation, Long Beach, Calif.

[21] Appl. No.: 246,271

[22] Filed: Mar. 23, 1981

[51] Int. Cl.³ .............................................. H01S 3/19
[52] U.S. Cl. .................................................... 372/44
[58] Field of Search ...................... 372/44, 50, 19, 33

[56] References Cited
PUBLICATIONS

Nyul, "Back-to-Back GaAs Injection Laser", Technical Notes, TNN. 786, A Publication of RCA, Princeton, N.J. pp. 1-3, Oct. 1968.

Primary Examiner—James W. Davie
Attorney, Agent, or Firm—Gregory A. Cone; Walter J. Jason; Donald L. Royer

[57] ABSTRACT

High power operation in conjunction with excellent mode stability is rendered possible by a unique configuration comprising the use of two injection laser diode sections in a crossed-junction configuration.

10 Claims, 2 Drawing Figures

MODE STABLE INJECTION LASER DIODE

BACKGROUND OF THE INVENTION

1. Field of the Invention

This invention relates to injection laser diodes. Still more particularly, this invention relates to a laser diode system comprising two stripe-geometry laser diodes operated in a crossed-junction configuration.

2. Description of the Prior Art

Semiconductor lasers were first developed in the early 1960's. The basic structure of a semiconductor laser is that of a P-N junction diode. Under appropriate conditions, charge carriers from each side of the junction combine within the junction to produce the laser light emission. Although semiconductor lasers may be excited by the use of electron beams as well as by optical pumping, by far the most common method of excitation is by charge carrier injection produced by forward biasing of the semiconductor diode by an external electric potential which drives both electrons and holes into the junction. The rather complex theory of semiconductor laser operation may be briefly summed up by stating that the energy levels of a pure semiconductor crystal are grouped in bands, each band representing a vast number of closely spaced levels. There are gaps between these bands—ranges of forbidden energy. At a low temperature, only the lowest bands of the semiconductor crystal atoms are filled with electrons and filled completely. The highest filled band is called the valence band; the lowest empty band, the conduction band, Excitation of such a crystal represents the transfer of an electron from the valence band into the conduction band and the creation of a hole in the valence band. Excitation occurs, for example, when light is absorbed in the semiconductor. Conversely, when an electron in the conduction band unites with a hole in the valence band, emission of radiation takes place. The thickness of the junction region from which the light originates is only a few micrometers.

When a junction diode is prepared for laser operation, its front and back surfaces normally are cut perpendicular to the plane of the junction and parallel to each other. These end surfaces form the terminating mirrors of the laser. The side surfaces are usually offset by a small angle or are roughly finished to avoid regeneration of radiation in an undesired direction. As the charge carrier injection into the semiconductor junction is increased, the emitted light intensity varies linearly until a threshold is reached, at which point the intensity of the emitted light increases rapidly, the radiation pattern becomes highly directional, and the spectral width of the emitted radiation is narrowed. These phenomena are characteristic of the onset of stimulated emission.

The above described simple device commonly has a random mode distribution, both longitudinally and transversally. This random mode distribution renders the simple device essentially unusable for any of the multitude of laser applications which require laser output mode stability. Indeed, in the simple injection laser diode, the mode spectra commonly will not reproduce from run to run for a given device. This difficulty was overcome by the development of the stripe-geometry injection laser diodes in the late 1960's. In these devices, the active region of the junction is confined to a relatively narrow stripe underneath one of the metallic contacts driving the device. The stripe-geometry devices are much more well-behaved than the simple geometry devices and can produce repeatable high resolution mode spectra. Nevertheless, even the stripe-geometry injection laser diode is incapable of stable single mode operation.

Stable single mode operation is extremely important because the greatest problem in use of the injection laser is in coupling the laser output effectively into either lenses or optical fibers. To this end, most such power starved systems require single gaussian mode operation for smallest spot size and beam divergence. Laser diodes, since they use flat crystal facets for integral internal mirrors, operate in a naturally unstable cavity configuration. Typically, a single heterostructure diode operates with about twenty milliwatts per mode, giving literally hundreds of modes in a typical ten-watt pulse. Moreover, peak power operation is limited to an average of one watt per mil of junction because statistical fluctuations cause large, instantaneous variations in the local facet power density. Continuous wave (CW) injection laser diodes operate in a single transverse mode only if an aperture of from about two to about five micrometers is provided in the cavity. This limits the peak power to about three millowatts per micrometer, or only about five to about fifteen milliwatts in any commercial diode. Making the diodes larger or wider gives additional mode control problems. Coupling diodes together along their junction planes as amplifiers by focusing one diode into another or by close coupling has inherent feedback noise problems and an unfortunate sub micron alignment maintenance requirement. In addition, injection laser diodes have such high gain that saturation occurs in only a few tens of microns with loss of power efficiency in the usual high power lasers. Greater efficiency can only be obtained in a longer diode by providing a diverging light configuration which is not possible in any published diode configuration. The other requirement usually made for high power lasers is a symmetrically expanding output beam which is not possible in any but the lowest power CW diode lasers.

SUMMARY OF THE INVENTION

This semiconductor injection laser system comprises an input injection laser diode optically connected to an output injection laser diode wherein the central axes of the two diodes are substantially parallel and the plane of the junction of the input laser diode is rotated relative to the plane of the junction of the output laser diode at an angle sufficient to achieve mode stability in the output of the system (normally about 45° to about 90°). This system can be operated in either a continuous wave or pulsed manner with a stable, single mode output with power scalability to several times that of any known diode, including multimode diodes.

DETAILED DESCRIPTION OF THE INVENTION

Briefly stated, this invention involves two laser diode sections operating in conjunction to force mode stability in the output laser beam. The principle involved is that the wave guide within an individual laser diode dictates the beam confinement and external divergence in a plane normal to its junction. Unfortunately, no such confinement normally exists in the other direction, that is parallel to the junction, particularly in large area diodes. This effect gives rise to wandering, low order modes and higher order mode oscillation. The laser diode system of this invention comprises two individual laser diodes, an input diode and an output diode, functioning as coupled oscillators. The diodes are placed in close proximity to each other, parallel and end-to-end, in a crossed-junction configuration.

Figure 1:
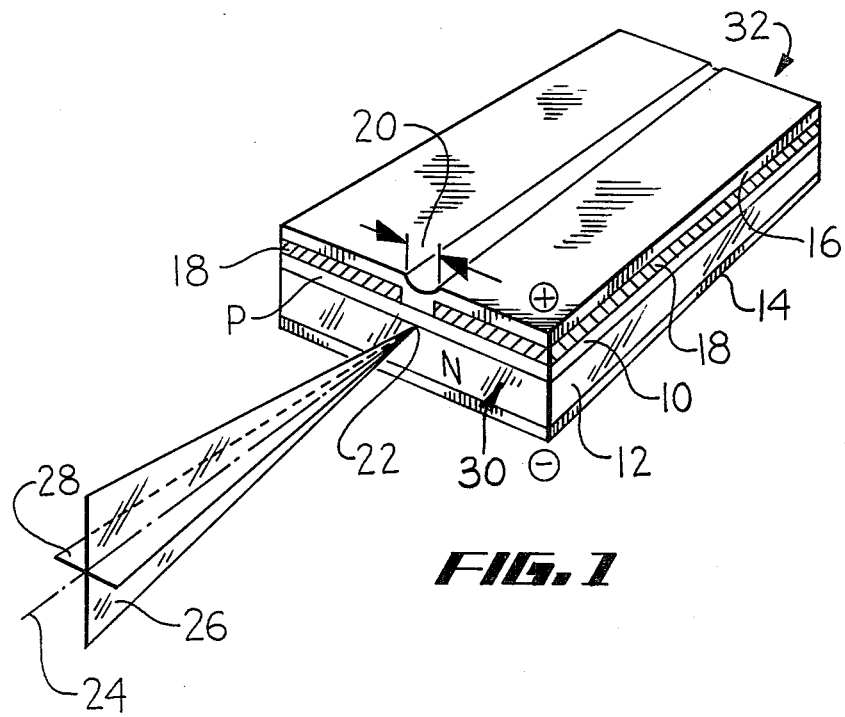
FIG. 1 is an isometric view of a conventional stripe-geometry injection laser diode.

The basic structure of a conventional stripe-geometry injection laser diode is shown in FIG. 1. Such diodes are most commonly constructed from gallium arsenide compounds and gallium aluminum arsenide compounds, although other III-V compounds have also been found to be suitable for this usage. Referring to FIG. 1, the basic diode structure is found in the presence of the P, 10, and N, 12, layers produced by appropriate impurity doping of the gallium arsenide or gallium aluminum arsenide layers within the diode. The junction, 22, between the P and N regions is a thin, only a few micrometers thick, region found between the P and N layers wherein recombination of charge carriers produced by injected current induces stimulated emission of radiation. In this particular diode, two insulating layers, 18, are grown on top of the P-region 10 with a narrow, uniform gap between the two insulated regions, forming the stripe having a definite width, 20. The P-region contact 16 is then deposited on top of the device and, because of the presence of the insulating layers 18, can only contact the P-region in the area of the stripe width 20. In this manner, the charge carrier injection from the P-region is concentrated into the area directly below the stripe, 20, and acts to confine the generation of the stimulated radiation to that area of the junction 22 immediately beneath the stripe, 20. The region below the junction 22 is taken up by relatively thick N-type layer 12, which in turn is underlain by a separate contact 14. The respective contacts 14 and 16 are appropriately biased in a forward direction as indicated. Once the rate of charge carrier injection into the junction exceeds the threshold current level necessary for stimulated emission of radiation, laser light will be produced in the junction region beneath the stripe. Inherent refractive differences between the layers in the laser diode confine the laser light to the region within the junction underlying the stripe. By appropriately coating the back surface 32 of the laser diode, the laser light will be emitted only through the front surface 30 of the diode in a direction generally coincident with the centerline 24 beneath the stripe. The longitudinal modes of the emitted laser light corresponding to the frequency content of the light are generally thought to be controlled by the length of the junction area underlying the stripe. The transverse modes of the emitted laser light correspond to the spatial dispersion of the wavefront of the emitted light and are thought to be controlled by the relative dimensions of the thickness of the junction layer and the width of the stripe. As mentioned above, the spatial dispersion of the emitted laser light along an axis perpendicular to the junction, 26, has a wider angular dispersion than that of the dispersion measured in a plane parallel to the junction 28. Nevertheless, the right angle dispersion 26 tends to be well controlled and stable, while the parallel dispersion 28 tends to wander and be susceptible to the generation of higher order modes under varying current injection levels. The problems of dispersion, wander, and higher order mode susceptibility are controlled by injection of an adequate signal level which controls the diode gain saturation.

Figure 2:
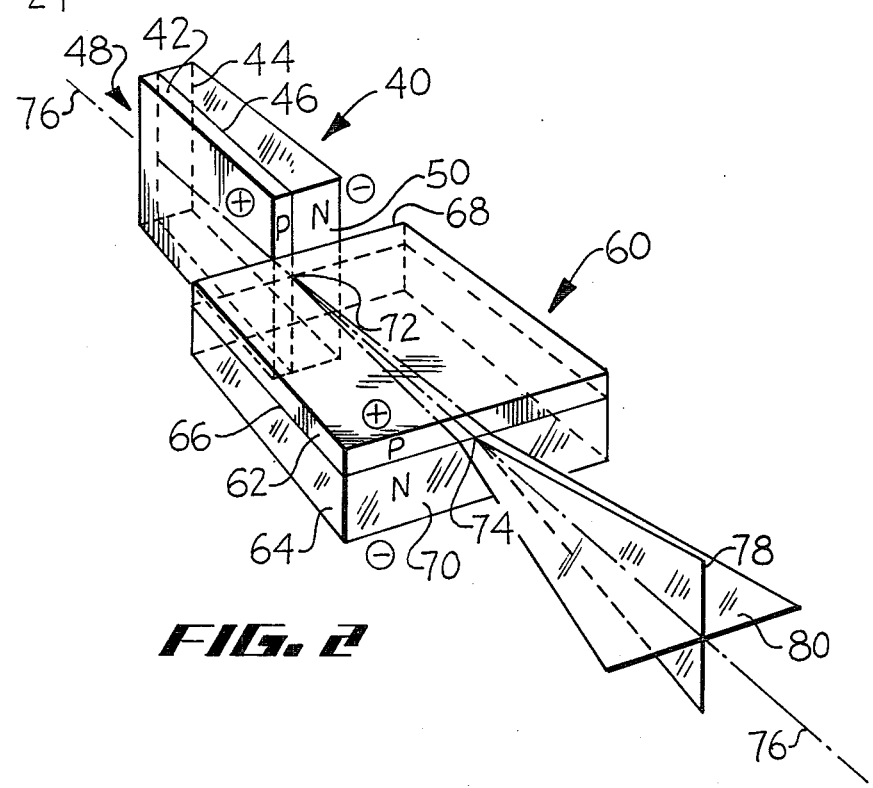
FIG. 2 is an isometric view of the semiconductor injection laser system of this invention.

FIG. 2 displays the basic configuration of the system of our invention. Two separate injection laser diodes, an input injection laser diode 40 and an output injection laser diode 60, are utilized. The input diode 40 is a forward biased junction diode with a P-layer 42 and N-layer 44 and a junction 46. In many instances, it will be desirable to coat the back surface 48 of the diode with a high reflectivity coating to improve the emission efficiency through the front surface of the diode 50. In most instances, it will be desirable to employ a stripe-geometry input injection laser diode, although for some purposes this may not be necessary. In such instances, the junction region underlying the stripe, not shown, would be substantially coincident with the centerline 76 of the system. The output injection laser diode 60 is of similar construction to the input injection laser diode 40, although, in most instances, somewhat larger. It also comprises a forward-biased diode with a P-region 62 and N-region 64 and a junction region 66. Its back surface 68 is placed in close optical communication with the front surface 50 of the input diode 40. Both of these surfaces are fabricated such that the reflectivity coefficient will be at a minimum. Again, for most purposes, it will be desirable to employ a stripe-geometry to the output injection laser 60. For such usages, the junction region underlying the stripe, not shown, will be substantially coincident with the centerline, 76, of the system. In any event, the stimulated emission of radiation in the input laser diode 40 will produce a laser light that enters into the junction region of the output laser diode 40 only through a relatively small aperture 72. As is shown in the figure, the planes of the junction regions of the respective input 40 and output 60 laser diodes are oriented at approximately 90° to one another. It is by this unique crossed-junction configuration that the mode stability in the output laser light from the injection laser diode system is attained.

Referring now to the discussion above involving the relative stability of the transverse mode of the output laser light of the conventional laser diode in FIG. 1 as measured in directions perpendicular to and parallel to the junction, it can be seen that the employment of the crossed-junction configuration of FIG. 2 for the two laser diodes will inject the stable component of the output laser light from the input laser diode 40 (26 in FIG. 1) into the plane of the junction of the output laser diode 60. The introduction of this stable component from the input diode 40 into the junction region of the output diode 60 will create an output component 80 from the output diode 60 in a plane parallel to the junction whose stability is enforced by the inherent stability of the component as it leaves the input diode 40. In a similar manner, the relatively unstable dispersion produced in a plane parallel to the junction in the input diode 40 will enter into the output diode 60 in a direction perpendicular to the junction of the output diode and therein be stabilized by the inherent optical stabilization characteristics of the waveguide in the junction region in a direction perpendicular to the plane of the junction region in the output diode 60 and thereby emitting from the output facet 70 of the output laser diode 60 a stable component 78 measured perpendicular to the junction region of the output diode 60. In this manner, the output from the injection laser diode system is emitted from a controlled area 74 of the output facet 70 of the output laser diode 60 with inherent stability in planes both perpendicular to 78 and parallel to 80, the plane of the junction region 66 of the output diode 60.

A variety of specific configurations may be used to optimize the performance of a particular system structure for a given application; however, two principles dominate the design. First, the amplified mode in the output diode has a dictated angular divergence equal to that of the output waveguide emission. Second, the two individual laser diodes must interact to give amplitude stable operation. Depending upon the desired application, the length of each diode and the stripe configurations are selected to give efficient long life performance. The coatings, gain, and feedback interaction are selected to give maximum saturated stable laser output. The angle between the injection planes of the input and output laser diodes will also depend on the application and the system construction. As such, this angle may vary from the 90° angle of the specific embodiment described above. In applications utilizing pulsed single heterostructure diodes, the peak power capacity will be enhanced because of the uniform power density distribution, and the stability of the system will allow larger area diodes to be fabricated for greater peak power than the currently available. For continuous wave applications, such as fiber optics sources and recorder applications, laser diode systems of from about 50 to about 500 milliwatts can be fabricated utilizing this crossed-junction system configuration. No loss of switching speed or other degradation of the inherent modulation capabilities of a laser diode system will occur through use of this system configuration. Fabrication of the device is relatively straightforward. At least four manufacturers offer individual state-of-the-art injection laser diodes: ITT Electro-Optical Products Division, RCA Incorporated, Laser Diode Laboratories Incorporated, and Spectronics Incorporated. Alignment of the two separate diode sections into the optimal crossed-junction configuration is not a particularly difficult fabrication procedure. The alignment tolerance is in excess of ten micrometers and has not presented any significant difficulties.

Specific construction details for a particular application of the system of this invention will depend largely upon the requirements of that application. Such construction details are, however, well within the expertise of one of ordinary skill in the art of injection laser diode operations.

We claim:

1. A semiconductor injection laser system comprising an input injection laser diode optically connected to an output injection laser diode wherein the central axes of the input diode and the output diode are substantially parallel and the plane of the junction of the input diode is rotated relative to the plane of the junction of the output diode at an angle sufficient to achieve mode stability in the laser output of the system.

2. The system of claim 1 wherein the input diode and the output diode comprise stripe-geometry injection laser diodes.

3. The system of claim 2 wherein the laser diodes comprise P-N junction diodes fabricated from a material selected from the group consisting of gallium arsenide, gallium aluminum arsenide, other Group III-V compounds, and combinations thereof.

4. The system of claim 3 wherein the longitudinal axes of the stripes of the input and output diodes are centered on the centerline of the system.

5. The system of claim 1 wherein the angle of rotation is from about 45° to about 90°.

6. The system of claim 1 wherein the angle of rotation is approximately 90°.

7. A method of operation of a semiconductor injection laser system wherein the system comprises an input injection laser diode optically connected to an output injection laser diode wherein the central axes of the input diode and the output diode are substantially parallel, and the plane of the junction of the input diode is rotated relative to the plane of the junction of the output diode at an angle sufficient to achieve mode stability in the laser output of the system comprising operating the system as a continuous wave system.

8. A method of operation of a semiconductor injection laser system wherein the system comprises an input injection laser diode optically connected to an output injection laser diode wherein the central axes of the input diode and the output diode are substantially parallel, and the plane of the junction of the input diode is rotated relative to the plane of the junction of the output diode at an angle sufficient to achieve mode stability in the laser output of the system comprising operating the system as a pulsed system.

9. The method of claim 7 or 8 wherein the angle of rotation is from about 45° to about 90°.

10. The method of claim 7 or 8 wherein the angle of rotation is approximately 90°.

* * * * *